US012575376B2

(12) United States Patent
Ricketts

(10) Patent No.: US 12,575,376 B2
(45) Date of Patent: Mar. 10, 2026

(54) SYSTEMS AND APPARATUS FOR A LIFT PIN ASSEMBLY

(71) Applicant: ASM IP Holding B.V., Almere (NL)

(72) Inventor: Matthew Ricketts, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 357 days.

(21) Appl. No.: 18/370,943

(22) Filed: Sep. 21, 2023

(65) Prior Publication Data

US 2024/0105495 A1 Mar. 28, 2024

Related U.S. Application Data

(60) Provisional application No. 63/409,867, filed on Sep. 26, 2022.

(51) Int. Cl.
*H01L 21/687* (2006.01)

(52) U.S. Cl.
CPC .............................. *H01L 21/68742* (2013.01)

(58) Field of Classification Search
CPC ................... H01L 21/68742; H01L 21/68785
USPC ........................................................ 269/54.5
See application file for complete search history.

(56) References Cited

U.S. PATENT DOCUMENTS

| | | | | | |
|---|---|---|---|---|---|
| 5,848,670 | A | * | 12/1998 | Salzman | ................... B66F 7/00 414/935 |
| 5,879,128 | A | * | 3/1999 | Tietz | ................. H01L 21/68742 414/757 |

| | | | | |
|---|---|---|---|---|
| 6,884,319 | B2 | | 4/2005 | Kim |
| 6,887,317 | B2 | | 5/2005 | Or |
| 7,204,888 | B2 | | 4/2007 | Tran |
| 8,107,800 | B2 | * | 1/2012 | Bezama .............. H01L 21/6875 392/407 |
| 8,256,754 | B2 | | 9/2012 | Lerner |
| 9,120,114 | B2 | * | 9/2015 | Jeong .................. C23C 16/4583 |
| 9,721,910 | B2 | * | 8/2017 | Hamaguchi ....... H01J 37/32715 |
| 10,195,704 | B2 | | 2/2019 | Himmelsbach |
| 10,262,887 | B2 | | 4/2019 | Hao |
| 10,332,778 | B2 | | 6/2019 | Pohl |
| 10,431,488 | B2 | | 10/2019 | Yoon |
| 10,460,977 | B2 | | 10/2019 | Breninger |
| 10,535,549 | B2 | | 1/2020 | Nguyen |
| 10,770,337 | B2 | | 9/2020 | Lee |
| 10,857,655 | B2 | | 12/2020 | Cuvalci |
| 11,004,722 | B2 | * | 5/2021 | Sarode Vishwanath ..................... H01L 21/67103 |
| 11,018,047 | B2 | | 5/2021 | Rokkam |
| 11,282,738 | B2 | | 3/2022 | Kim |
| 11,387,080 | B2 | | 7/2022 | Hayashi |
| 11,508,611 | B2 | | 11/2022 | Ghosh |

(Continued)

FOREIGN PATENT DOCUMENTS

| | | |
|---|---|---|
| CN | 201348719 Y | 11/2009 |
| JP | 3138694 B2 | 2/2001 |

(Continued)

*Primary Examiner* — Jason L Vaughan
(74) *Attorney, Agent, or Firm* — Snell & Wilmer L.L.P.

(57) ABSTRACT

Various embodiments of the present technology may provide a system and apparatus for a lift pin assembly. The lift pin assembly may include a lift pin and a weight attached to and surrounding a portion of the lift pin. The weight may include a first member and a second member that attach to each other by a screw. Each member may have a channel. The channels of each member may form a through-hole to receive the lift pin.

20 Claims, 5 Drawing Sheets

(56) References Cited

U.S. PATENT DOCUMENTS

| | | | |
|---|---|---|---|
| 11,651,990 B2 * | 5/2023 | Han | H01L 21/68785 |
| | | | 414/416.11 |
| 12,020,977 B2 * | 6/2024 | Sulyman | H01L 21/68785 |
| 2003/0075387 A1 | 4/2003 | Wang | |
| 2006/0156987 A1 | 7/2006 | Lai | |
| 2006/0156988 A1 | 7/2006 | Wu | |
| 2007/0089672 A1 * | 4/2007 | Shimamura | C23C 16/4586 |
| | | | 204/192.12 |
| 2007/0258407 A1 | 11/2007 | Li | |
| 2009/0314211 A1 * | 12/2009 | Du Bois | H01L 21/68742 |
| | | | 118/729 |
| 2010/0101491 A1 | 4/2010 | Aida | |
| 2011/0033620 A1 | 2/2011 | Polyak | |
| 2013/0206069 A1 * | 8/2013 | Kim | C23C 16/4586 |
| | | | 118/728 |
| 2015/0121987 A1 | 5/2015 | Flynn | |
| 2020/0157678 A1 | 5/2020 | Schaller | |
| 2021/0358797 A1 | 11/2021 | Sovenahalli | |
| 2022/0293451 A1 | 9/2022 | Sulyman | |
| 2023/0099332 A1 | 3/2023 | Breninger | |
| 2023/0187260 A1 | 6/2023 | Jeong | |

FOREIGN PATENT DOCUMENTS

| | | | |
|---|---|---|---|
| JP | 4111703 | B2 | 7/2008 |
| KR | 20040022530 | A | 3/2004 |
| KR | 200381260 | Y1 | 4/2005 |
| KR | 100553102 | B1 | 2/2006 |
| KR | 20070009241 | A | 1/2007 |
| KR | 20070023380 | A | 2/2007 |
| KR | 20070071418 | A | 7/2007 |
| KR | 20070091842 | A | 9/2007 |
| KR | 100833315 | B1 | 5/2008 |
| KR | 20090067455 | A | 6/2009 |
| KR | 200461690 | Y1 | 7/2012 |
| KR | 101281403 | B1 | 7/2013 |
| KR | 101327742 | B1 | 11/2013 |
| KR | 101433864 | B1 | 9/2014 |
| KR | 20170003322 | A | 1/2017 |
| KR | 20220128543 | A | 9/2022 |
| TW | 219438 | S | 6/2022 |
| WO | 2022162928 | A1 | 8/2022 |
| WO | 2022194342 | A1 | 9/2022 |

* cited by examiner

SYSTEMS AND APPARATUS FOR A LIFT PIN ASSEMBLY

CROSS-REFERENCE TO RELATED APPLICATIONS

This application is a nonprovisional of, and claims priority to and the benefit of, U.S. Provisional Patent Application No. 63/409,867, filed Sep. 26, 2022 and entitled "SYSTEMS AND APPARATUS FOR A LIFT PIN ASSEMBLY," which is hereby incorporated by reference herein.

BACKGROUND OF THE TECHNOLOGY

During the semiconductor manufacturing process, lift pins may be used facilitate loading and unloading of a wafer on to and from a susceptor. In most cases, the lift pins extend through holes in the susceptor. The wafer may be lifted off the surface of the susceptor by actuating the lift pins through a stationary susceptor. During use, the lift pins may become stuck in an undesirable position within the susceptor. Accordingly, a design that prevents or reduces sticking may be desired.

SUMMARY OF THE INVENTION

Various embodiments of the present technology may provide a system and apparatus for a lift pin assembly. The lift pin assembly may include a lift pin and a weight attached to and surrounding a portion of the lift pin. The weight may include a first member and a second member that attach to each other by a screw. Each member may have a channel. The channels of each member may form a through-hole to receive the lift pin.

According to one aspect, a lift pin assembly comprises a lift pin comprising: a shaft comprising: a first section having a first diameter and comprising a first end and a second end; a second section coupled directly to the second end of the first section and having a second diameter; and a third section coupled directly to the second section and having a third diameter; and a pin head coupled to the first end of the first section; and a weight attached to the second section of the shaft and comprising a first member and a second member, wherein each of the first and second members comprises: a top end having a first edge that extends away from the second section of the shaft by a first distance; and a bottom end, opposite the top end, having a second edge that extends away from the second section of the shaft by a second distance, wherein the second distance is less than the first distance.

According to another aspect, a lift pin assembly comprises a lift pin comprising: a shaft comprising: a first section having a first diameter and comprising a first end and a second end; a second section connected directly to the second end of the first section and having a second diameter; and a third section coupled directly to the second section and having a third diameter; and a pin head connected to the first end of the first section; and a weight surrounding the second section of the shaft and comprising a first member joined to a second member, wherein each of the first and second members comprises a channel that forms a through-hole extending from a top end of the weight to a bottom end of the weight, wherein the second section of the shaft extends through and is bounded by the through-hole.

According to yet another aspect, a weight capable of attaching to a lift pin comprises a first member attached to a second member, wherein each of the first and second members comprises: an interior facing surface; a top end and a bottom end; and a channel along the interior-facing surface that extends from the top end to the bottom; wherein: the top end having a first edge that extends away from the channel by a first distance; the bottom end, opposite the top end, having a second edge that extends away from the channel by a second distance, wherein the second distance is less than the first distance; the interior-facing surface of the first member abuts the interior-facing surface of the second member; and the channels of the first and second members form a through-hole that is capable of encircling a portion of the lift pin.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates a system in accordance with an exemplary embodiment of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various fasteners and materials to form the lift pins and weights. Further, the present technology may employ any number techniques for manufacturing lift pins and weights.

Figure 1:
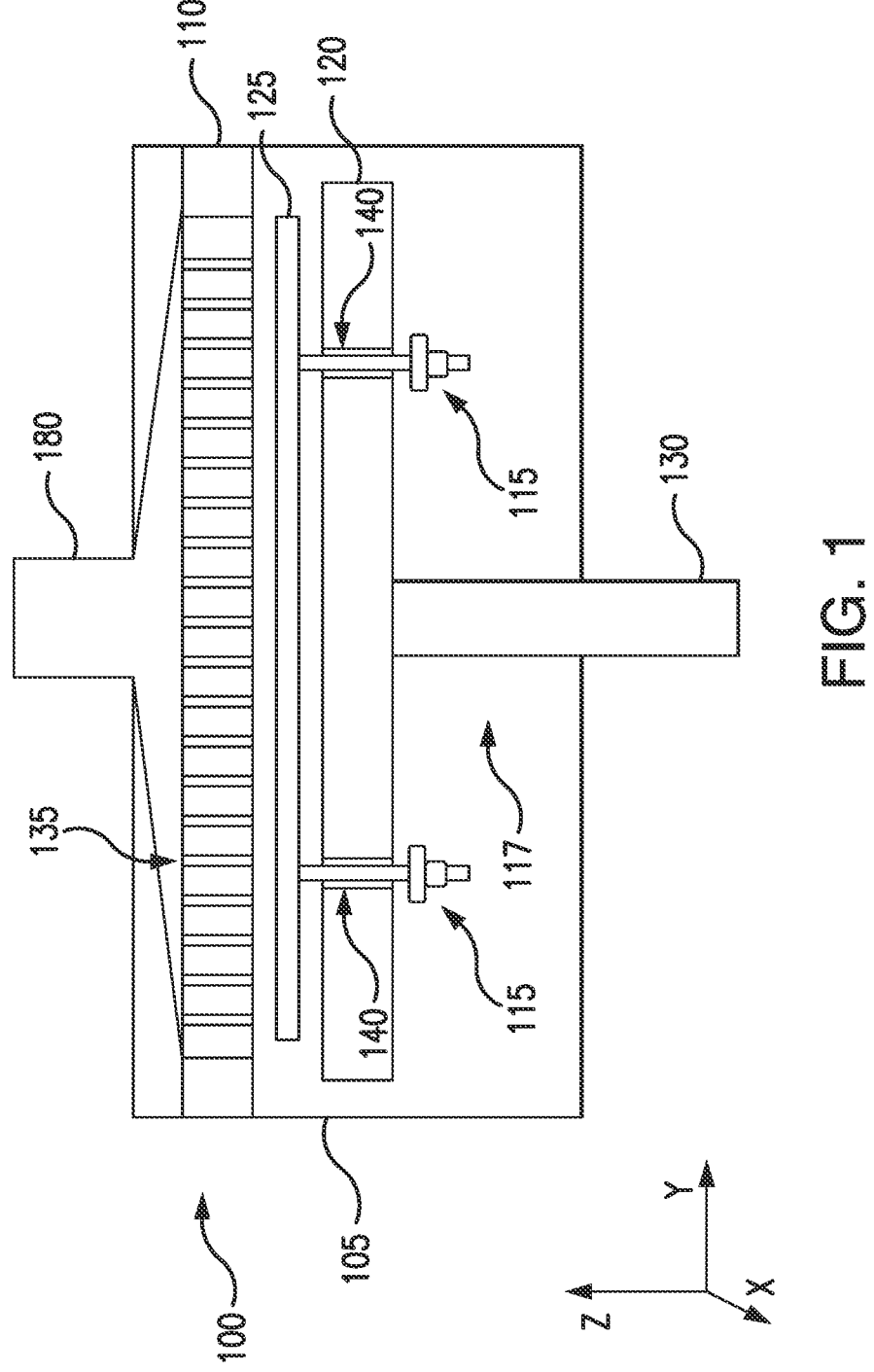
Figure 2:
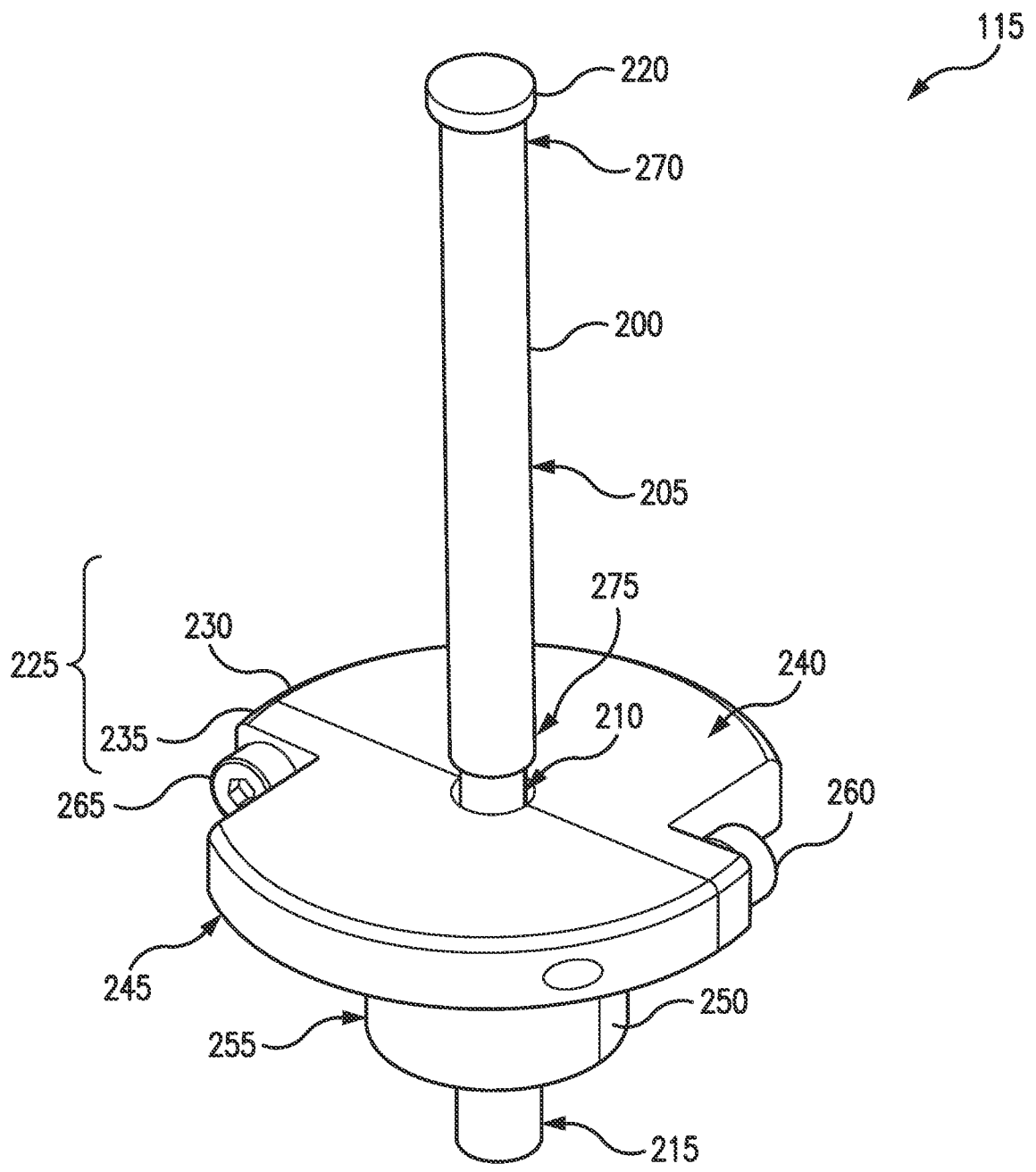
FIG. 2 is a perspective view of a lift pin assembly in accordance with an exemplary embodiment of the present technology.
Figure 3:
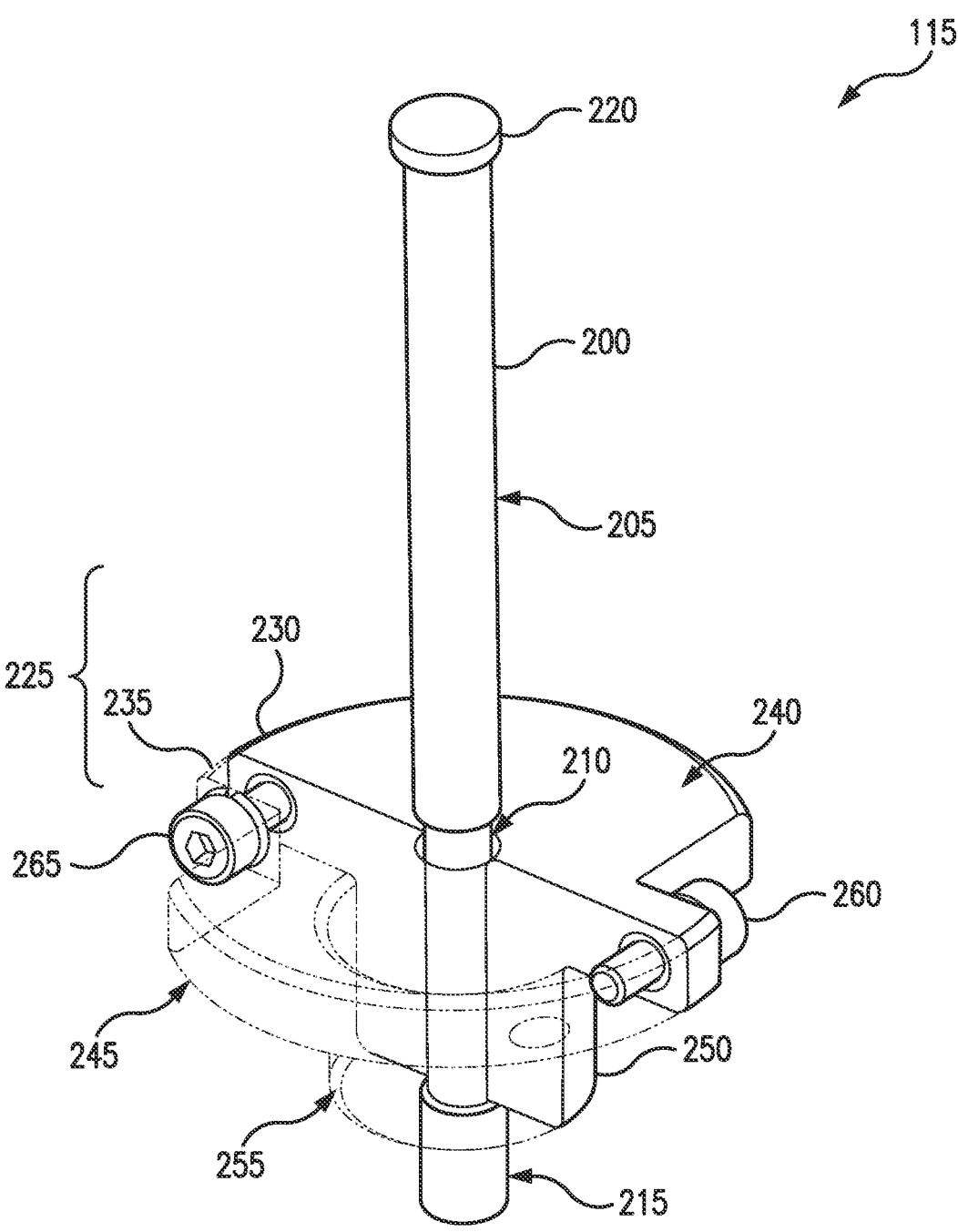
FIG. 3 is a perspective view of a lift pin assembly in accordance with an exemplary embodiment of the present technology.
Figure 4:
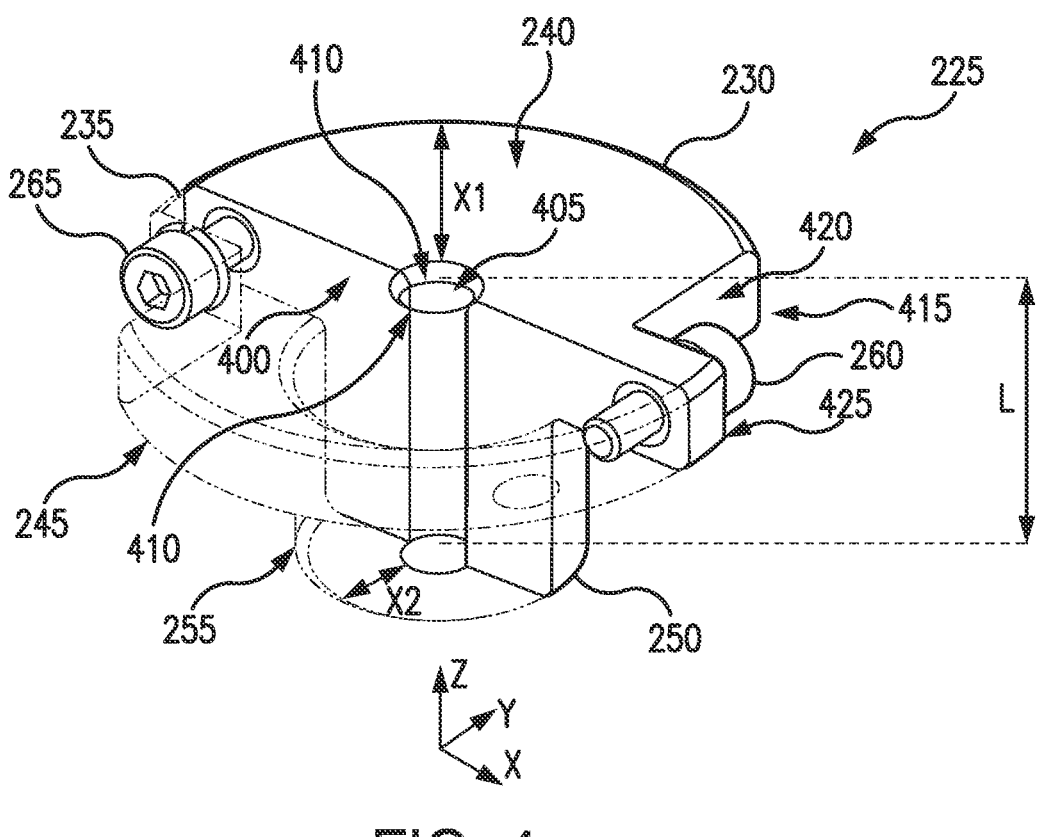
FIG. 4 is a perspective view of a weight in accordance with an exemplary embodiment of the present technology.
Figure 5:
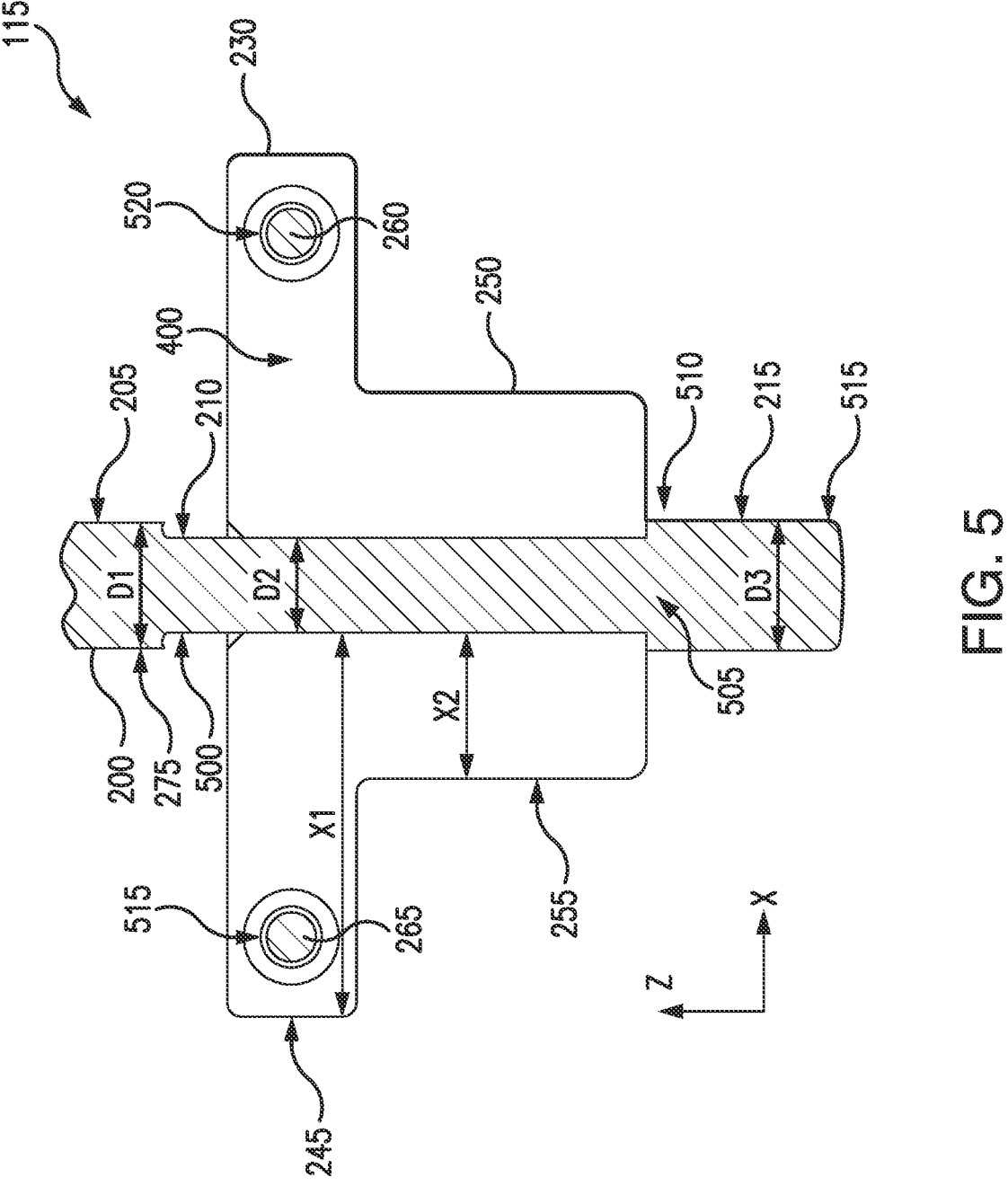
FIG. 5 is a cross sectional view of a portion of the lift pin assembly in accordance with an exemplary embodiment of the present technology.

Referring to FIG. 1, an exemplary system 100 may comprise a reaction chamber 105 and a showerhead 110 for processing a substrate, such as a wafer 125. The reaction chamber 103 may comprise an interior space 102 defined by a vertically-oriented sidewalls, a horizontally-oriented bottom surface, and the showerhead 110. The system 100 may further comprise an inlet 180 to deliver various precursors to the reaction chamber 105 via the showerhead 110.

The showerhead 110 may comprise a plurality of through-holes 135 configured to flow precursor from the inlet 180 toward the wafer 125. The showerhead 110 may be positioned adjacent to and supported by the sidewall of the reaction chamber 105.

The system 100 may further comprise a susceptor 117 disposed within the interior space 102 of the reaction chamber 105 and configured to support the wafer 125. The susceptor 117 may comprise a plate 120 supported by a pedestal 130. In various embodiments, the susceptor 117 may be configured to move up and down along a z-axis (Z).

However, in other embodiments, the susceptor 117 may remain stationary. In various embodiments, the plate 120 may be formed from ceramic (alumina, AlOx), or a metal (e.g., stainless steel, Hastelloy, or the like). The plate 120 may comprise a top surface that is horizontally-oriented and positioned directly below the showerhead 110. The wafer 125 (or other substrate) may rest on the top surface of the plate 120 during processing. The plate 120 may comprise a heating element (not shown) configured to heat the wafer 125 during processing. The heating element may comprise any suitable heating element and may be arranged in any desired shape or pattern. In various embodiments, the plate 120 may further comprise through-holes 140.

In various embodiments, the system 100 may further comprise a lift pin assembly 115 configured to lift the wafer 125 off of the plate 120. In various embodiments, the system 100 may comprise a plurality of lift pin assemblies 115, such as 3 or more. The lift pin assembly 115 extends through the through-hole 140 in the plate 120. In various embodiments, the lift pin assembly 115 remains stationary relative to the plate 120, while the plate 120 moves in along the z-axis. In other embodiments, the lift pin assembly 115 moves in along the z-axis while the plate 120 remains stationary relative to the lift pin assembly 115.

Referring to FIGS. 2-5, in an exemplary embodiment, the lift pin assembly 115 may comprise a lift pin 200 and a weight 225 that operate in conjunction with each other to lift the wafer 125 off the plate 120 and also to facilitate placing the wafer 125 on the plate 120. The weight 225 may be configured to apply a downward force on the lift pin 200. For example, the weight 225 may weigh 15-30 grams, for example 24 grams. In various embodiments, the weight 225 may be surround a portion of the lift pin 115, and the weight may be positioned near the bottom of the lift pin 115, such that the weight 225 is adjacent to a bottom surface, opposite the top surface, of the plate 120 (FIG. 1). In various embodiments, the lift pin 200 may comprise a metal material (e.g., stainless steel, titanium, or aluminum) or a ceramic material (e.g., alumina, AlOx). In various embodiments, the weight 225 may comprise a metal material (e.g., stainless steel, titanium, or aluminum).

In various embodiments, the lift pin 200 may comprise a shaft having a first section 205, a second section 210, and a third section 215 along an axis of the lift pin 200. The axis extends along the length of the lift pin 200. The first section 205 may comprise a first end 270 and a second end 275. The second section 210 may comprise a first end 500 and a second end 505. The third section 215 may comprise a first end 510 and a second end 515. In various embodiments, the second section 210 may be located between the first section 205 and the third section 215. For example, the first end 500 of the second section 210 may be directly connected to the second end of the first section 205, and the second end 505 of the second section 210 may be directly connected to the first end 510 of the third section 215. Each section 205, 210, 215 may have a cylindrical shape.

In various embodiments, the first section 205 has a first diameter D1, the second section 210 has a second diameter D2, and the third section 215 has a third diameter D3. In an exemplary embodiment, the third diameter D3 is greater than the second diameter D2. For example, the third diameter D3 may range from 3.5 mm to 4.5 mm, and the second diameter D2 may range from 2.0 mm to 2.5 mm. In addition, the first diameter D1 may be greater than the second diameter D2. For example, the first diameter D1 may range from 3.50 mm to 4.00 mm. In addition, the first diameter D1 and the third diameter D3 may be substantially equal (e.g., 5% tolerance).

In various embodiments, the lift pin 200 may further comprise a pin head 220 connected to the first end 270 of the first section 205. The pin head 220 may have any suitable shape and size.

In various embodiments, the weight 225 may surround at least a portion of the second section 210 of the lift pin 200. In an exemplary embodiment, the weight 225 may not surround the first section 205 or the third section 215. In various embodiments, the weight 225 may comprise a first member 230 and a second member 235. Each member 230, 235 may comprise a top end 230 having a top surface 240 and a bottom end 250. In addition, each member 230, 235 may comprise an interior-facing surface 400. The interior facing surfaces of each member 230, 235 may be configured to abut each other. For example, the top end 230 of the first member 230 may align with the top end 230 of the second member 235 and the bottom end of the first member 230 may align with the bottom end 250 of the second member 235. In particular, the first and second members 230, 235 have the same shape and dimensions.

In various embodiments, the top end 230 may have a first edge 245 that extends away from the channel 410 by a first distance X1. In various embodiments, the first distance X1 may range from 1.5 mm to 2.5 mm. In an exemplary embodiment, the first distance X1 is 2.0 mm. In various embodiments, the first edge 245 may comprise an arched portion.

In various embodiments, the bottom end 250 may have a second edge 255 that extends away from the channel 410 by a second distance X2. In various embodiments, the second distance X2 may range from 4.0 mm to 6.5 mm. In an exemplary embodiment, the second distance X2 is 5.0 mm. In various embodiments, the second distance X2 is less than the first distance X1. In various embodiments, the second edge 255 may form a semi-circular shape.

In an exemplary embodiment, each of the first and second members 230, 235 may comprise a channel 410 (e.g., a semi-circular cutout) extending vertically along each member 230, 235 and having a length L. In various embodiments, the length may range from 10 mm to 20 mm. In an exemplary embodiment, the length is 15 mm. The channel 410 may be formed within the interior-facing surface 400 of each member 230, 235. Together, the channels 410 of each member 230, 235 may form a through-hole 405 that extends from the top surface 240 to the bottom end 255. The first and second members 230, 235 may surround or otherwise encircle a portion of the lift pin. For example, the first and second members 230, 235 may surround at least a portion of the second section 210 of the lift pin 200. In an exemplary embodiment, a portion of the second section 210 is exposed to allow the weight 230 to expand along the length of the lift pin 200 when the lift pin assembly 115 is subjected to high temperatures (e.g., 450° C.) during wafer processing. If a portion of the second section 210 is not exposed, expansion of the weight 230 may apply undesirable stress on the lift pin 200, which may cause the lift pin 200 to break or fracture.

In various embodiments, the top end 230 of each member 230, 235 may further comprise a notched region 415 defined by a first linear edge 420 and a second linear edge 425 that is perpendicular to the first linear edge 420. The first linear edge 420 is continuous with the first edge 245, and the second linear edge 425 is continuous with the first linear edge 420.

In various embodiments, each member 230, 235 may further comprise a threaded through-hole 520. In an exemplary embodiment, the threaded through-hole 520 may be located on the top surface 230 and may extend from second linear edge 425 to the interior-facing surface 400. The threaded through-hole 520 may be located near the outer edge 245.

In various embodiments, each member 230, 235 may further comprise a threaded hole 515. In an exemplary embodiment, the threaded hole 515 may be located on the top surface 230 at an edge opposite from the threaded through-hole 520. The threaded hole 515 of one member (e.g., the first member 230) may be positioned to align with the threaded through-hole 520 of the other member (e.g., the second member 235).

In various embodiments, the lift pin assembly 115 may further comprise a screw configured to secure the first member 230 to the second member 235. In an exemplary embodiment, the lift pin assembly 115 may comprise a first screw 260 and a second screw 265. Each of the first and second screws 260, 265 may be threaded to mate with the threads of the threaded through-hole 515 and the threaded hole 520. For example, the first screw 260 may be configured to mate with the threaded through-hole 520 and the second screw 265 may be configured to mate with the threaded hole 515. Each screw 260, 265 may have an axis along the length of the screw. When installed, the axis of the screws 260, 265 may be perpendicular to the axis of the lift pin 200.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

What is claimed is:

1. A lift pin assembly, comprising:
   a lift pin comprising:
      a shaft comprising:
         a first section having a first diameter and comprising a first end and a second end;
         a second section coupled directly to the second end of the first section and having a second diameter; and
         a third section coupled directly to the second section and having a third diameter; and
      a pin head coupled to the first end of the first section; and
   a weight attached to the second section of the shaft and comprising a first member and a second member, wherein each of the first and second members comprises:
      a top end having a first edge that extends away from the second section of the shaft by a first distance; and
      a bottom end, opposite the top end, having a second edge that extends away from the second section of the shaft by a second distance, wherein the second distance is less than the first distance.

2. The lift pin assembly according to claim 1, wherein each of the first and second members further comprise a channel that forms a through-hole that extends from the top end to the bottom end.

3. The lift pin assembly according to claim 2, wherein the second section of the shaft is bound by the through-hole.

4. The lift pin assembly according to claim 1, wherein the first member is attached to the second member by a screw that extends through the top end of the first member and into the top end of the second member.

5. The lift pin assembly according to claim 1, wherein the first edge comprises an arched section.

6. The lift pin assembly according to claim 1, wherein the first diameter is equal to the third diameter, and the second diameter is less than the first diameter.

7. The lift pin assembly according to claim 1, wherein the first diameter is greater than the third diameter, and the second diameter is less than the first and third diameters.

8. The lift pin assembly according to claim 1, wherein the first diameter is less than the third diameter, and the second diameter is less than the first and third diameters.

9. A lift pin assembly, comprising:

a lift pin comprising:

a shaft comprising:

a first section having a first diameter and comprising a first end and a second end;

a second section connected directly to the second end of the first section and having a second diameter; and a third section coupled directly to the second section and having a third diameter; and a pin head connected to the first end of the first section; and a weight surrounding the second section of the shaft and comprising a first member joined to a second member, wherein each of the first and second members comprises a channel that forms a through-hole extending from a top end of the weight to a bottom end of the weight, wherein the second section of the shaft extends through and is bounded by the through-hole.

10. The lift pin assembly according to claim 9, wherein the top end comprises a first edge that extends away from the channel by a first distance.

11. The lift pin assembly according to claim 10, wherein the first edge comprises an arched section.

12. The lift pin assembly according to claim 10, wherein the bottom end comprises a second edge that extends away from the channel by a second distance, wherein the second distance is less than the first distance.

13. The lift pin assembly according to claim 9, wherein the second diameter is less than the first and third diameters.

14. The lift pin assembly according to claim 9, wherein the top end of each of the first and second members further comprises a threaded hole, and the first member is joined to the second member by a threaded screw that mates with the threaded holes.

15. The lift pin assembly according to claim 14, wherein the mated threaded screw is perpendicular to the shaft of the lift pin.

16. A weight capable of attaching to a lift pin, comprising:

a first member attached to a second member, wherein each of the first and second members comprises:

an interior facing surface;

a top end and a bottom end; and a channel along the interior-facing surface that extends from the top end to the bottom;

wherein:

the top end having a first edge that extends away from the channel by a first distance;

the bottom end, opposite the top end, having a second edge that extends away from the channel by a second distance, wherein the second distance is less than the first distance;

the interior-facing surface of the first member abuts the interior-facing surface of the second member; and the channels of the first and second members form a through-hole that is capable of encircling a portion of the lift pin.

17. The weight according to claim 16, wherein the top end of each of the first and second members further comprises a threaded hole and a threaded through-hole, and wherein the first member is joined to the second member by a threaded screw that mates with the threaded hole of one member and the threaded through-hole of the other member.

18. The weight according to claim 16, wherein the top end comprises:

an arched edge; and a notched region defined by a linear edge.

19. The weight according to claim 18, wherein the weight further comprises a threaded hole located near the arched edge and a threaded through-hole extending from the linear edge to the interior-facing surface.

20. The weight according to claim 19, wherein the threaded hole of the first member aligns with the threaded through-hole of the second member.

* * * * *